(12) United States Patent
Li

(10) Patent No.: US 8,723,178 B2
(45) Date of Patent: May 13, 2014

(54) INTEGRATED FIELD EFFECT TRANSISTORS WITH HIGH VOLTAGE DRAIN SENSING

(75) Inventor: Tiesheng Li, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 26 days.

(21) Appl. No.: 13/355,324

(22) Filed: Jan. 20, 2012

(65) Prior Publication Data

US 2013/0187160 A1    Jul. 25, 2013

(51) Int. Cl.
*H01L 29/04* (2006.01)
*H01L 29/10* (2006.01)
*H01L 29/15* (2006.01)

(52) U.S. Cl.
USPC .................... 257/57; 257/77; 257/E29.04

(58) Field of Classification Search
USPC .......................................................... 257/57
See application file for complete search history.

(56) References Cited

U.S. PATENT DOCUMENTS

| | | | |
|---|---|---|---|
| 4,914,058 A | 4/1990 | Blanchard | |
| 5,767,545 A * | 6/1998 | Takahashi | ..................... 257/341 |
| 6,008,520 A | 12/1999 | Darwish et al. | |
| 6,331,456 B1 | 12/2001 | Wu | |
| 6,555,873 B2 | 4/2003 | Disney et al. | |
| 6,635,544 B2 | 10/2003 | Disney | |
| 6,750,105 B2 | 6/2004 | Disney | |
| 6,838,346 B2 | 1/2005 | Disney | |
| 6,900,091 B2 | 5/2005 | Williams et al. | |
| 6,943,426 B2 | 9/2005 | Williams et al. | |
| 7,227,225 B2 | 6/2007 | Ono et al. | |
| 7,232,726 B2 | 6/2007 | Peake et al. | |
| 7,253,042 B2 | 8/2007 | Disney | |
| 7,422,938 B2 | 9/2008 | Williams | |
| 7,489,016 B2 | 2/2009 | Williams et al. | |

(Continued)

OTHER PUBLICATIONS

MPS—MP6901—Fast Turn-off Intelligent Rectifier, Oct. 13, 2010, pp. 1-11, Rev. 1.0.

(Continued)

*Primary Examiner* — Matthew Landau
*Assistant Examiner* — Igwe U Anya
(74) *Attorney, Agent, or Firm* — Okamoto & Benedicto LLP

(57) ABSTRACT

An integrated circuit includes a junction field effect transistor (JFET) and a power metal oxide semiconductor field effect transistor (MOSFET) on a same substrate. The integrated circuit includes a drain sense terminal for sensing the drain of the power MOSFET through the JFET. The JFET protects a controller or other electrical circuit coupled to the drain sense terminal from high voltage that may be present on the drain of the power MOSFET. The JFET and the power MOSFET share a same drift region, which includes an epitaxial layer formed on the substrate. The integrated circuit may be packaged in a four terminal small outline integrated circuit (SOIC) package. The integrated circuit may be employed in a variety of applications including as an ideal diode.

11 Claims, 10 Drawing Sheets

(56) References Cited

U.S. PATENT DOCUMENTS

| | | |
|---|---|---|
| 7,652,326 B2 | 1/2010 | Kocon |
| 7,701,033 B2 | 4/2010 | Williams et al. |
| 7,719,054 B2 | 5/2010 | Williams et al. |
| 7,737,526 B2 | 6/2010 | Williams et al. |
| 7,741,661 B2 | 6/2010 | Disney et al. |
| 7,745,291 B2 | 6/2010 | Disney et al. |
| 7,977,193 B1 | 7/2011 | Disney et al. |
| 7,977,742 B1 | 7/2011 | Disney |
| 2003/0117825 A1* | 6/2003 | Liaw et al. .................... 363/147 |
| 2006/0192256 A1* | 8/2006 | Cooper et al. ................ 257/401 |
| 2006/0216879 A1* | 9/2006 | Nonaka et al. ................ 438/186 |
| 2010/0232081 A1* | 9/2010 | Disney ........................ 361/91.5 |
| 2011/0127586 A1* | 6/2011 | Bobde et al. .................. 257/262 |
| 2011/0199148 A1* | 8/2011 | Iwamura ....................... 327/430 |
| 2012/0267704 A1* | 10/2012 | Siemieniec et al. .......... 257/328 |

OTHER PUBLICATIONS

Power MOSFET—from Wikipedia, the free encyclopedia, pp. 1-10 [retrieved on Jul. 3, 2010], retrieved from the internet: http://en.wikipedia.org/wiki/Power_MOSFET.

Power semiconductor device—from Wikipedia, the free encyclopedia, pp. 1-6 [retrieved on Jul. 2, 2010], retrieved from the internet: http://en.wikipedia.org/wiki/Power_semiconductor_device.

* cited by examiner

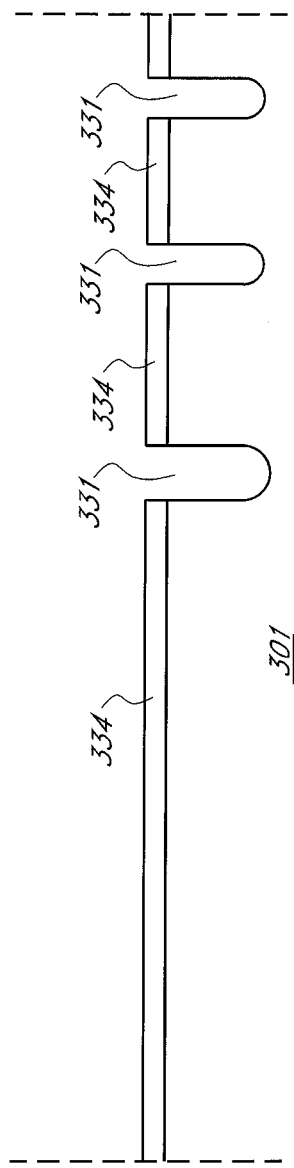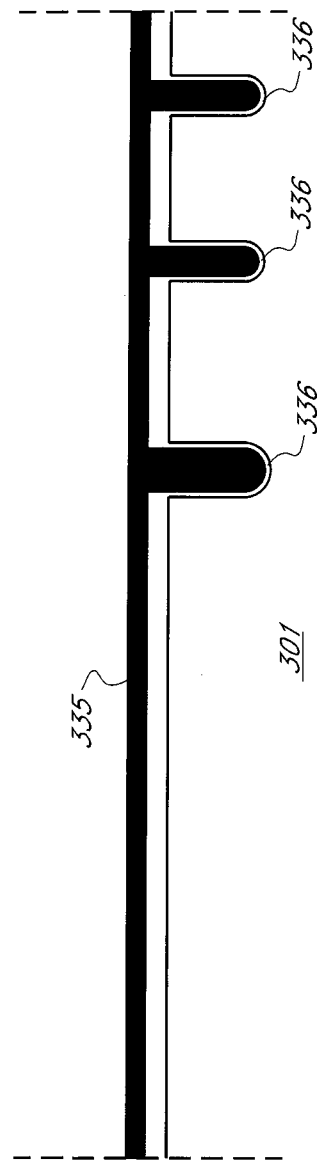

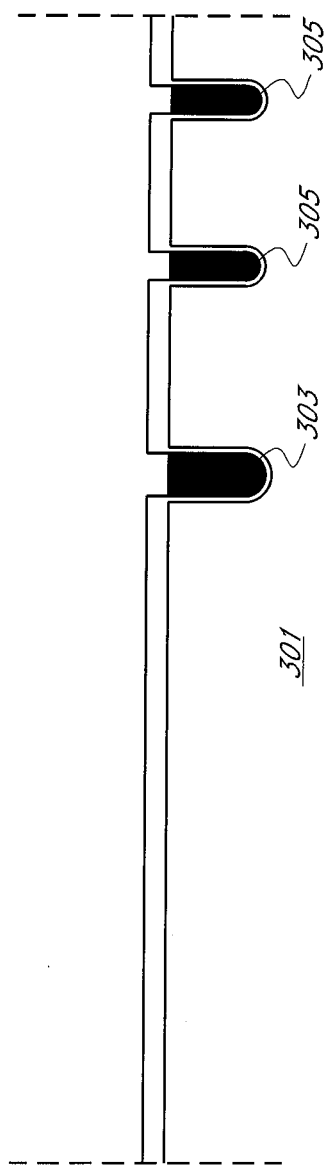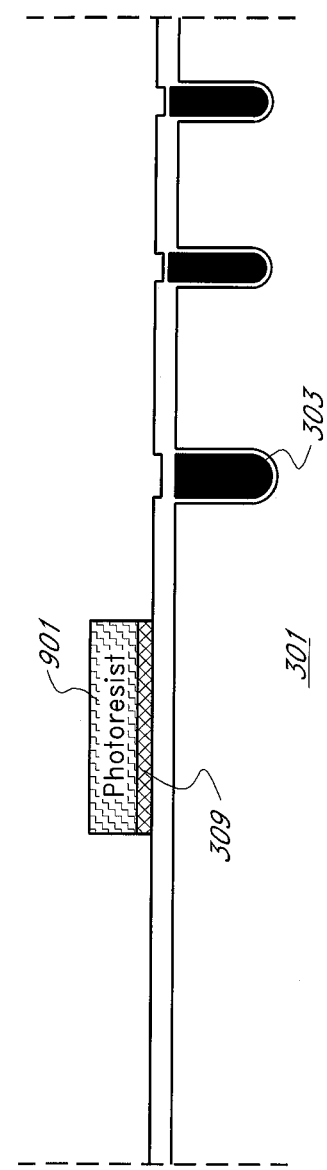

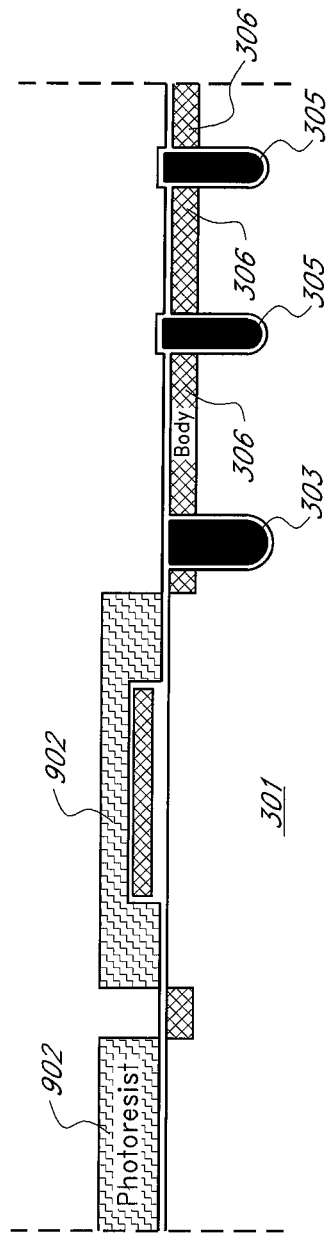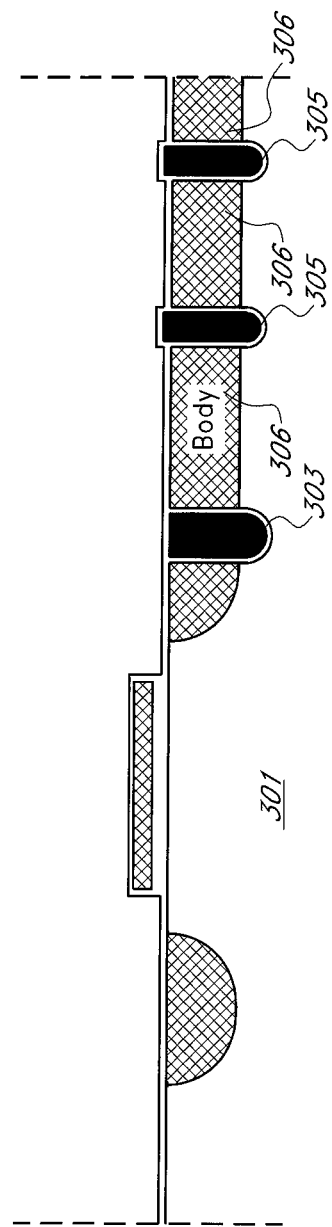

INTEGRATED FIELD EFFECT TRANSISTORS WITH HIGH VOLTAGE DRAIN SENSING

BACKGROUND OF THE INVENTION

1. Field of the Invention

The present invention relates generally to electrical circuits, and more particularly but not exclusively to field effect transistor circuits.

2. Description of the Background Art

Field effect transistors (FETs) are employed in a variety of electrical circuits. In some applications, the drain voltage of an FET needs to be sensed by a controller circuit to control the operation of the FET. For example, the controller may need to switch the FET on or off depending on the drain voltage. In some applications, the drain of the FET may have a high voltage. In that case, direct connection to the drain may damage the controller.

SUMMARY

In one embodiment, an integrated circuit comprises (a) a power metal oxide semiconductor field effect transistor (MOSFET) having a drain, a gate, and a source, (b) a junction field effect transistor (JFET) having a drain, a gate, and a source, the source of the JFET being coupled to a drain sense terminal of the integrated circuit, the drain of the JFET being coupled to the drain of the power MOSFET and a drain terminal of the integrated circuit, the JFET and the power MOSFET sharing a same drift region on a substrate of the integrated circuit, (c) a source terminal of the integrated circuit coupled to the source of the power MOSFET, and (d) a gate terminal of the integrated circuit coupled to the gate of the power MOSFET.

In one embodiment, a method of fabricating an integrated circuit comprises forming an epitaxial layer over a substrate, forming a source and a gate of a vertical MOSFET in the epitaxial layer, and forming a source and a gate of a vertical JFET in the epitaxial layer, wherein the vertical MOSFET and the vertical JFET are formed to share a same drift region comprising the epitaxial layer, and the vertical MOSFET and the vertical JFET are formed to have the substrate as a drain.

In one embodiment, an integrated circuit comprises a power MOSFET, a JFET sharing a same drift region with the power MOSFET on a same substrate, a drain sense terminal coupled to a drain of the power MOSFET through the JFET, the drain sense terminal being external to a package of the integrated circuit and configured to allow an external circuit to sense the drain of the power MOSFET, and a gate terminal coupled to a gate of the power MOSFET, the gate terminal being external to the package of the integrated circuit.

These and other features of the present invention will be readily apparent to persons of ordinary skill in the art upon reading the entirety of this disclosure, which includes the accompanying drawings and claims.

DESCRIPTION OF THE DRAWINGS

FIGS. 4-15 are cross-sections schematically illustrating the fabrication of the integrated circuit of FIG. 2 in accordance with an embodiment of the present invention.

The use of the same reference label in different figures indicates the same or like components. The figures are not drawn to scale.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
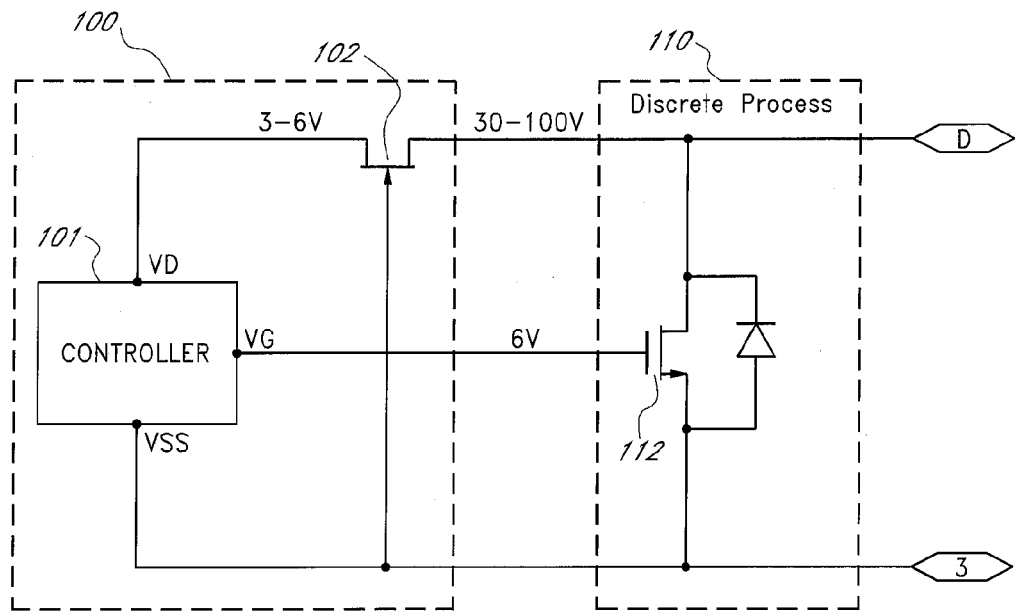
FIG. 1 is a schematic diagram illustrating an example circuit that involves sensing the drain voltage of a MOSFET.

FIG. 1 is a schematic diagram illustrating an example circuit that involves sensing the drain voltage of a metal-oxide semiconductor field effect transistor (MOSFET) 112. In the example of FIG. 1, the MOSFET 112 is a power MOSFET with a drain voltage that may reach as high as 30-100V. The controller 101, however, can only handle voltages of about 3-6V. A junction field effect transistor (JFET) 102 allows the controller 101 to sense the voltage on the drain of the MOSFET 112 without directly being exposed to high voltages.

Like a typical power device, the MOSFET 112 is a discrete device packaged by itself as a discrete device 110. The JFET 102 and the controller 101 are integrated on the same die and packaged together as a controller device 100. The inventor believes that integrating the JFET 102 with the controller 101 on the same die has at least two disadvantages. First, connecting the controller 101 to the external MOSFET 112 by way of the JFET 102 may lead to substrate injection because the drain voltage of the MOSFET 112 can be between −0.8V to −1.0V. Second, the process for fabricating the controller 101 allows for a low threshold voltage but cannot handle voltages higher than 30V, which may be needed in some high voltage applications.

Figure 2:
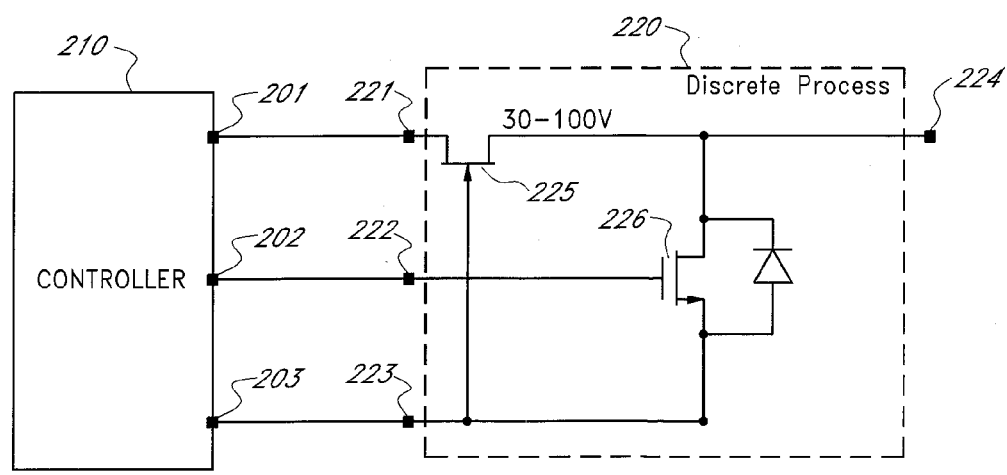
FIG. 2 is a schematic diagram of an integrated circuit with high voltage drain sensing in accordance with an embodiment of the present invention.

FIG. 2 is a schematic diagram of an integrated circuit 220 with high voltage drain sensing in accordance with an embodiment of the present invention. In the example of FIG. 2, the integrated circuit 220 only includes a vertical JFET 225 and a vertical power MOSFET 226 that are formed on the same die and packaged together. The diode shown across the power MOSFET 226 is the body diode of the power MOSFET 226 and is not a separate discrete component. The JFET 225 and power MOSFET 226 may be packaged in a four terminal SOIC (small outline integrated circuit) package, for example. The integrated circuit 220 may be packaged to have terminals 221, 222, 223, and 224. The terminals 221-224 are external pins and allow an external circuit to be electrically coupled to components in the integrated circuit 220. The terminal 221 is a drain sense terminal in that it connects to the drain of the power MOSFET 226 through the JFET 225, which is normally on. The JFET 225 protects the controller 210 from high voltages that may be present on the drain of the power MOSFET 226. In the example of FIG. 2, the drain sense terminal 221 is connected to the source of the JFET 225. The gate terminal 222, source terminal 223, and drain terminal 224 directly connect to the gate, source, and drain, respectively, of the power MOSFET 226. The drain of the JFET 225 is connected to the drain of the power MOSFET 226.

The integrated circuit 220 may be employed in a variety of applications that require sensing of drain voltage. For example, the integrated circuit 220 may be employed as an ideal diode, i.e., serving as a diode but with lower forward voltage drop than a conventional diode. The integrated circuit 220 may also be employed in various other applications without detracting from the merits of the present invention.

In one embodiment, to facilitate sensing of the drain voltage of the power MOSFET 226, the JFET 225 and the power MOSFET 226 are fabricated to share the same drift region on the same substrate. The drift region may comprise an epitaxial layer formed on the substrate, and the substrate may serve as the drain of both the power MOSFET 226 and the JFET 225. Advantageously, because the JFET 225 and the power MOSFET 226 share similar electrical characteristics, they may be fabricated using the same discrete fabrication process that allows for high voltages.

In the example of FIG. 2, the integrated circuit 220 is external to the controller 210. The controller 210 is fabricated on its own substrate and is thus not constrained by the electrical requirements of the JFET 225 and the power MOSFET 226. The controller 210 may be a diode-emulator controller, a solar panel controller, a controller of a synchronous switch of a voltage regulator, and so on. The controller 210 may include terminals 201, 202, and 203. The terminal 201 of the controller 210 may be connected to the terminal 221 of the integrated circuit 220 to allow the controller 210 to sense the voltage on the drain of the power MOSFET 226. The terminals 202 and 203 of the controller 210 may be connected to the terminals 222 and 223, respectively, of the integrated circuit 220. Connecting the terminal 202 of the controller 210 to the terminal 222 of the integrated circuit 220 allows the controller 210 to control switching of the power MOSFET 226.

Figure 3:
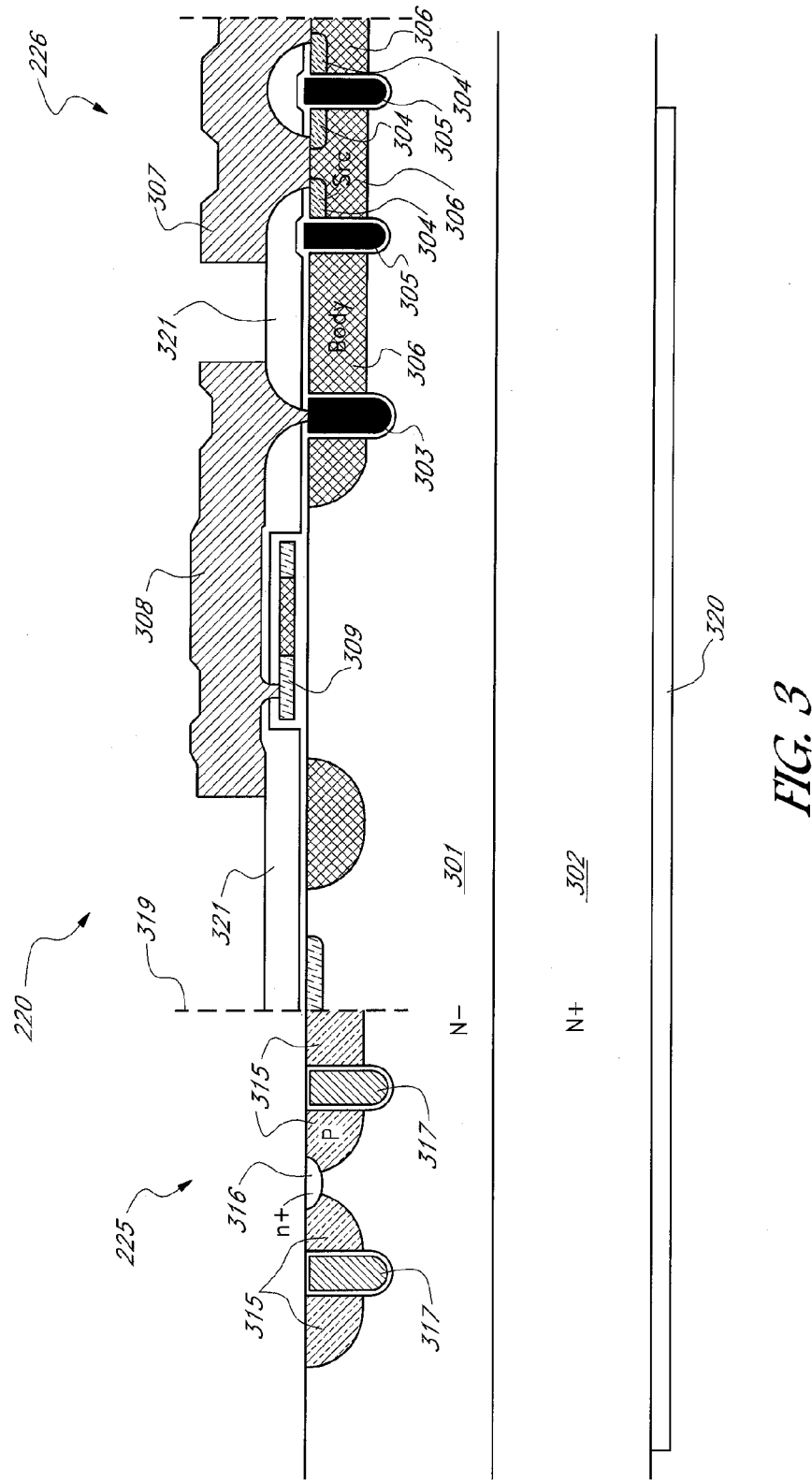
FIG. 3 schematically shows a cross-section of the integrated circuit of FIG. 2 in accordance with an embodiment of the present invention.

FIG. 3 schematically shows a cross-section of the integrated circuit 220 in accordance with an embodiment of the present invention. The integrated circuit 220 integrates the JFET 225 and the power MOSFET 226 together on the same N+ silicon substrate 302. The epitaxial layer 301 may be lightly doped with an N-type dopant (e.g., phosphorus), and the substrate 302 may be heavily doped with the same N-type dopant. In the example of FIG. 3, the dashed line 319 schematically represents a division between the JFET 225 and the power MOSFET 226.

In the example of FIG. 3, the power MOSFET 226 is a vertical trench-gate MOSFET having source N+ source regions 304, P-type body regions 306, and gates 305. A source electrode 307 electrically connects to the source regions 304 and the body regions 306. A gate electrode (not shown) electrically connects to the gates 305 in another dimension, e.g., in a direction going into the plane of FIG. 3. A drain electrode 320 electrically connects to the substrate 302, which serves as the drain region of the power MOSFET 226 and the JFET 225. The power MOSFET 226 is shown in FIG. 3 with an optional electro-static discharge (ESD) pad 309 that is electrically connected to a guard ring 303 by an ESD electrode 308. An interlayer dielectric (ILD) 321 provides electrical insulation between the metallization layer comprising the electrodes and underlying structures.

The power MOSFET 226 operates similar to a conventional vertical trench-gate MOSFET. More specifically, the power MOSFET 226 is switched on by applying a positive voltage greater than the threshold voltage on a gate 305, creating an inversion layer, or channel, along the interface of a gate dielectric (see 336 in FIG. 5) of the gate 305 and body regions 306. This allows electron current to flow from an N+ source region 304 through the channel in the body region 306 and into the drift region, i.e., N− epitaxial layer 301. Electron current in the drift region continues flowing to the N+ substrate 302 and to the drain electrode 320. In the OFF-state, the gate voltage is reduced so that there is no channel for electron current to flow.

The JFET 225 is formed on the same N− epitaxial layer 301 and N+ substrate 302 as the power MOSFET 226. In the example of FIG. 3, the JFET 225 is a vertical trench-gate JFET. The JFET 225 comprises an N+ source region 316, gates 317, and P-type body regions 315. Like the power MOSFET 226, the N+ substrate 302 serves as the drain of the JFET 225. Source and gate electrodes of the JFET 225 are not shown in FIG. 3. The JFET 225 is a normally on transistor. To switch off the JFET 225, voltage is applied to the gate 317 such that the P-N junction formed by the P-type body region 315 and the N− epitaxial layer is reversed bias to pinch off current flow to the source region 316. Removing the reverse biasing voltage on the gate 317 restores the JFET 225 back to its normally on state. The JFET 225 allows sensing of the drain voltage of the power MOSFET 226 by sharing the same drift region, which includes the N− epitaxial layer 301.

FIGS. 4-15 are cross-sections schematically illustrating the fabrication of the integrated circuit 220 in accordance with an embodiment of the present invention. As can be appreciated, process steps not necessary to the understanding of the invention have been omitted in the interest of clarity. Also, fabrication of integrated circuit 220 is illustrated by first showing the steps for fabricating the power MOSFET 226 then the JFET 225. As can be appreciated, the order these transistors are fabricated may be changed without detracting from the merits of the present invention. More specifically, one or more structures of the JFET 225 may be formed in the same fabrication step as one or more structures of the MOSFET 226 depending on the particulars of the fabrication process.

As shown in FIG. 3, the JFET 225 and power MOSFET 226 may be fabricated on the N− epitaxial layer 301 formed on the N+ substrate 302. The N− (i.e., lightly doped with an N-type dopant) epitaxial layer 301 may be grown on the N+(i.e., heavily doped with an N-type dopant) substrate 302. In one embodiment, the N+ substrate 302 comprises a silicon substrate. The N− epitaxial layer 301 may be grown by vapor phase epitaxy, for example. The N+ substrate 302 and the drain electrode 320 are not shown in FIGS. 4-15 for clarity of illustration.

In FIG. 4, an interlayer dielectric (ILD) 334 is formed on the N− epitaxial layer 301. The ILD 334 may comprise any suitable dielectric material, such as silicon nitride and/or silicon dioxide. The trenches 331 are formed in the N− epitaxial layer 301 by reactive ion etching, for example.

In FIG. 5, a gate dielectric 336 is formed in the trenches 331. The gate dielectric 336 may comprise one or more suitable dielectric materials. In one embodiment, the gate dielectric 336 comprises thermal oxide grown on the surface of the trenches 331. Following formation of the gate dielectric 336, a gate material 335 is deposited in each of the trenches 331. The gate material 335 may comprise a conductive material, which in one embodiment comprises doped polysilicon.

In FIG. 6, excess gate material 335 on the surface of the N− epitaxial layer 102 is removed such that the surface is substantially planarized. Planarization may be accomplished by etch-back and/or chemical mechanical planarization (CMP), for example. Remaining portions of the gate material 335 in the trenches serve as the guard ring 303 and gates 305.

In FIG. 7, the ESD pad 309 is formed by masking (see mask 901) and etching techniques. The ESD pad 309 is an optional feature of the integrated circuit 220.

In FIG. 8, the P-type body regions 306 are formed in the N− epitaxial layer 301. The P-type body regions 306 may be formed by forming a mask 902 and implanting P-type dopants, such as boron, into exposed portions of the N− epitaxial layer 301.

In FIG. 9, a body diffusion or drive in step is performed to drive the P-type dopants of the body regions 306 deeper into the N− epitaxial layer 301.

Figure 10:
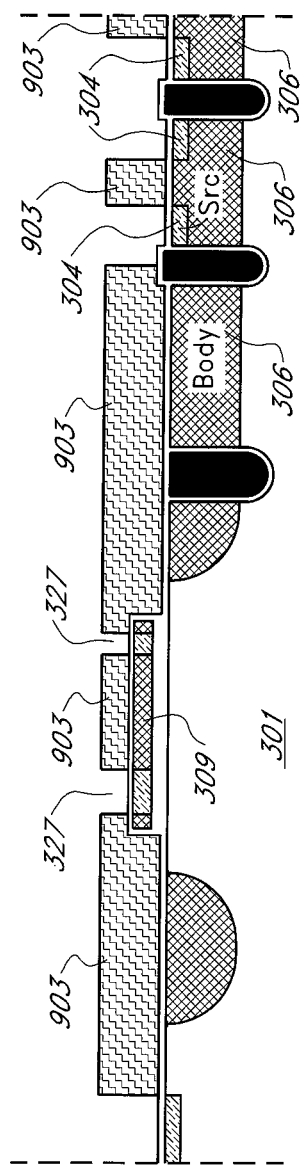

In FIG. 10, a mask 903 defines locations where the N+ source regions 304 are to be formed. Implantation of N-type dopants for the N+ source regions 304 is performed using the mask 903. In the example of FIG. 10, the N+ source regions 304 are formed in the body regions 306. The N-type dopants are also implanted through features 327 of the mask 903 into the ESD pad 309 to make the ESD pad 309 more conductive, and to form the n-side of p-n junctions of ESD protection diodes stack.

Figure 11:
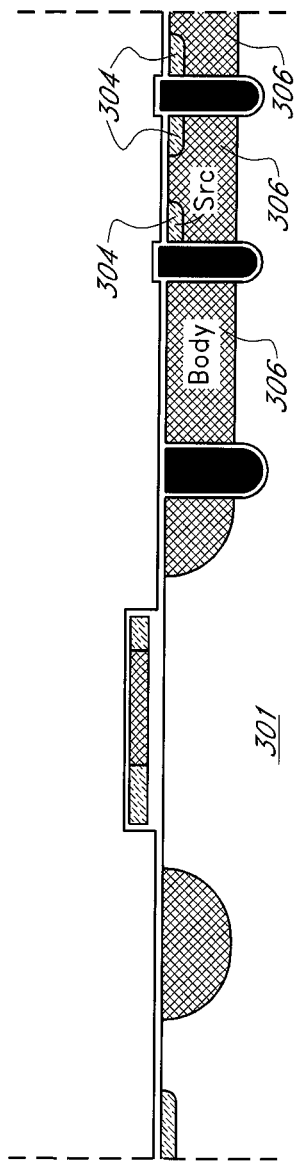

In FIG. 11, a source diffusion or drive in step is performed to drive the N-type dopants of the source regions 304 deeper into the body regions 306.

Figure 12:
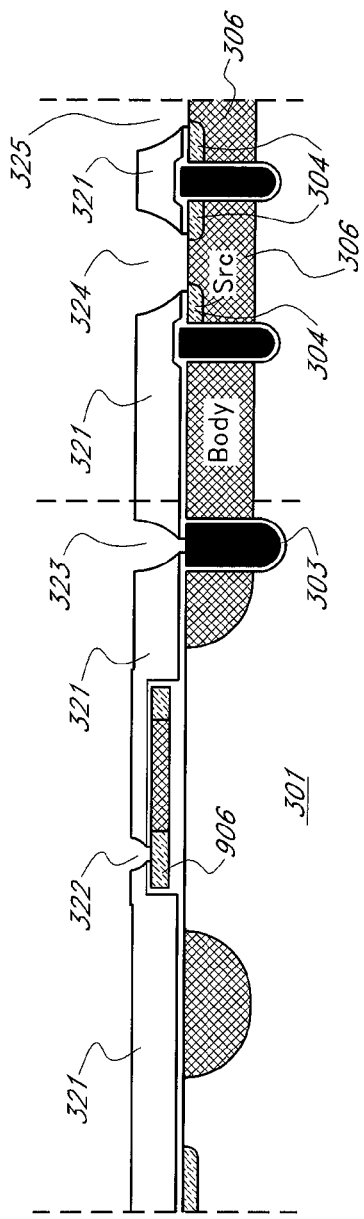

In FIG. 12, the ILD 321 is formed over the N− epitaxial layer 301. Contact holes 322-325 are then formed through the ILD 321 to expose the conductive portion of the ESD pad 906, the guard ring 303, the source regions 304, and the body regions 306. The contact holes 322-325 may be formed by masking and etching techniques.

Figure 13:
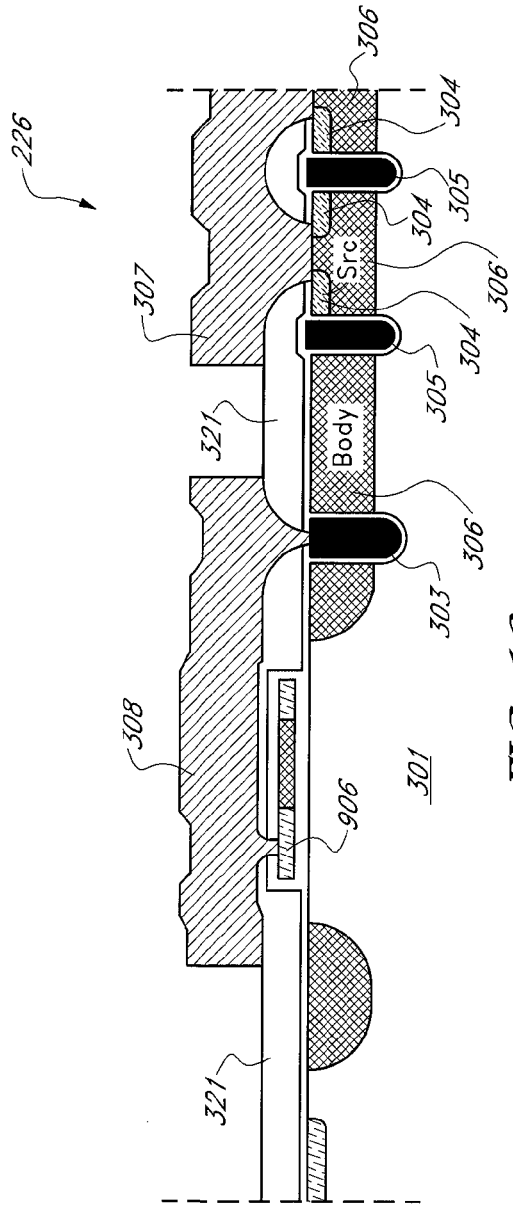

In FIG. 13, one or more metallization layers (e.g. aluminum, copper, silicide, or the like) are deposited and patterned using conventional techniques to form the ESD electrode 308, the source electrode 307, and the drain electrode 320 (shown in FIG. 3). The N+ substrate 302 may be thinned from the backside and then a metallization layer deposited on the back of the substrate 302 to form drain electrode 320 (see FIG. 3). The metallization step may be formed after the JFET 225 is fabricated. A passivation layer (not shown) may be deposited and patterned on top of the metallization layer for higher voltage ratings.

Figure 14:
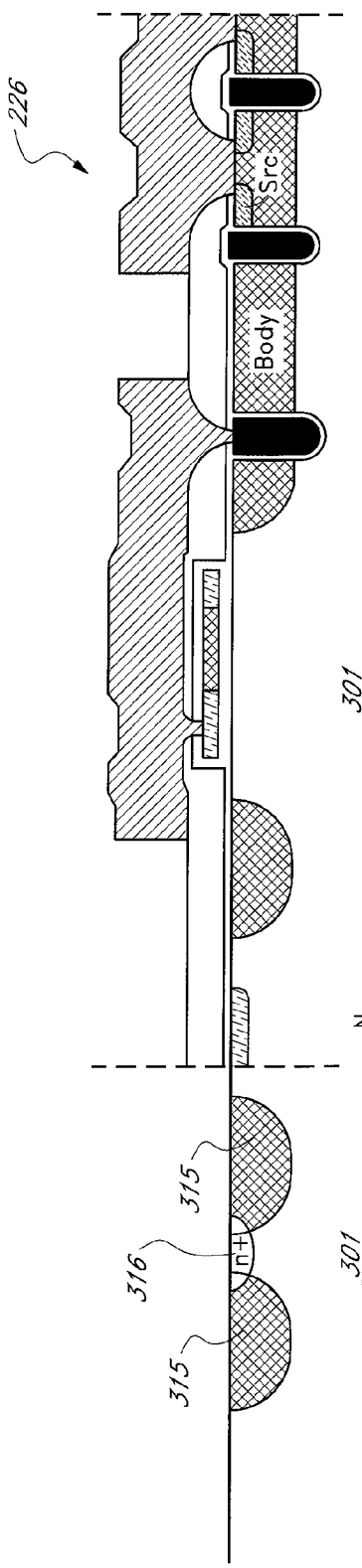

The fabrication of the JFET 225 is now explained beginning with FIG. 14. In FIG. 14, the P-type body regions 315 are formed by implanting P-type dopants into the N− epitaxial layer 301. The P-type body regions 315 may be formed in the same implantation step as with the P-type body regions 306 (see FIG. 8). The source region 316 is formed by implanting N-type dopants in the N− epitaxial layer 301 between the P-type body regions 315.

Figure 15:
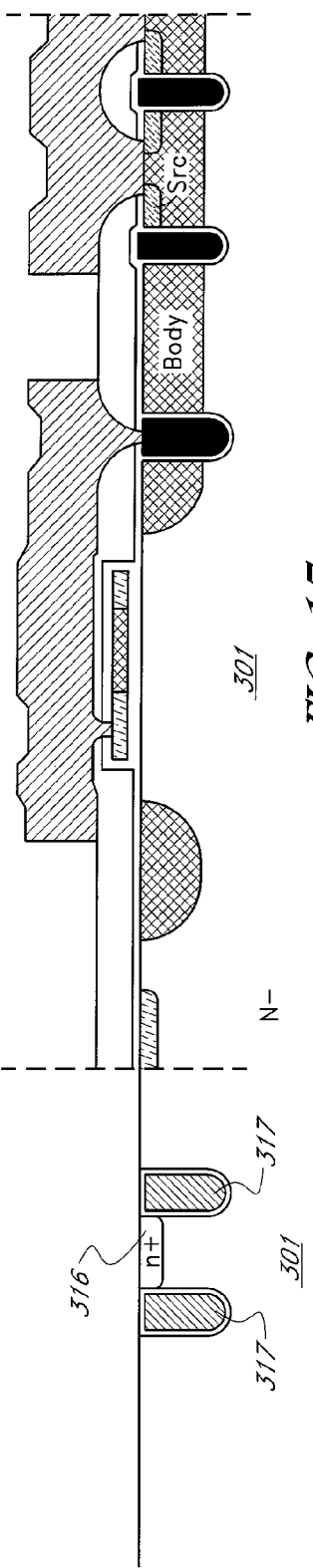

In FIG. 15, trenches are formed in the N− epitaxial layer 301. The trenches are, filled with a gate dielectric then filled with a gate material, which is planarized to form the gates 317. The gate material may comprise doped polysilicon, for example. The doped polysilicon may be planarized by etch back or CMP. The gates 317 are formed through the P-type body regions 315 in the N− epitaxial layer 301 as shown in FIG. 3. As can be appreciated, the trenches and gate dielectric of the gates 317 may also be formed at the same time as those of the gates 305, with appropriate changes to the order of the fabrication steps.

The integrated circuit 220 may be employed in a variety of applications. Generally speaking, the integrated circuit 220 is especially suitable in applications where a controller or other electrical circuit needs to sense a drain voltage of a power MOSFET.

Figure 16:
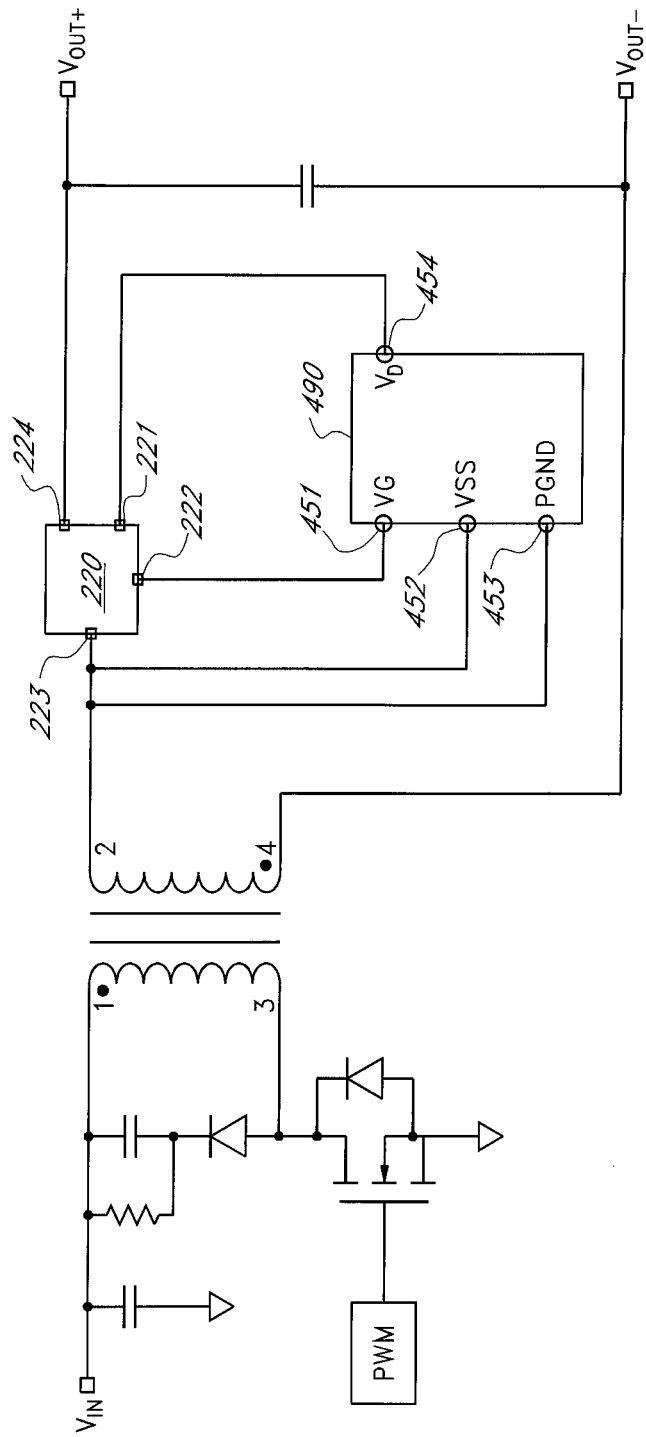
FIG. 16 is a schematic diagram illustrating an application where the integrated circuit of FIG. 2 is employed as an ideal diode in accordance with an embodiment of the present invention.

FIG. 16 is a schematic diagram illustrating an application where the integrated circuit 220 is employed as an ideal diode in accordance with an embodiment of the present invention.

In the example of FIG. 16, the integrated circuit 220 is controlled by a controller 490, which may be a diode-emulator controller. An example diode-emulator design that may be adapted to use the integrated circuit 220 includes the MP6901 diode-emulator integrated circuit from Monolithic Power Systems, Inc. As can be appreciated, the integrated circuit 220 may also serve as an external switch for other types of diode-emulator controllers. The terminals 221-224 of the integrated circuit are connected to the terminals 451-454 of the controller 490 as shown.

The controller 490 is configured to regulate the forward drop of the power MOSFET 226 of the integrated circuit 220 and to switch the power MOSFET 226 off when the forward drop becomes negative. The controller 490 senses the forward drop of the power MOSFET 226 by sensing the drain voltage of the power MOSFET 226 by way of the drain sense terminal 221, which is connected to the Vd terminal 454 of the controller 490. The JFET 225 of the integrated circuit 220 protects the controller 490 from high voltage on the drain of the power MOSFET 226 as previously described. The Vg terminal 451 of the controller 490 is connected to the gate terminal 222 to allow the controller 490 to control switching of the power MOSFET 226. The source terminal 223 of the integrated circuit 220 is connected to the Vss terminal 452 and the PGND terminal 453 of the controller 490 in a Kelvin sensing configuration.

Figure 17:
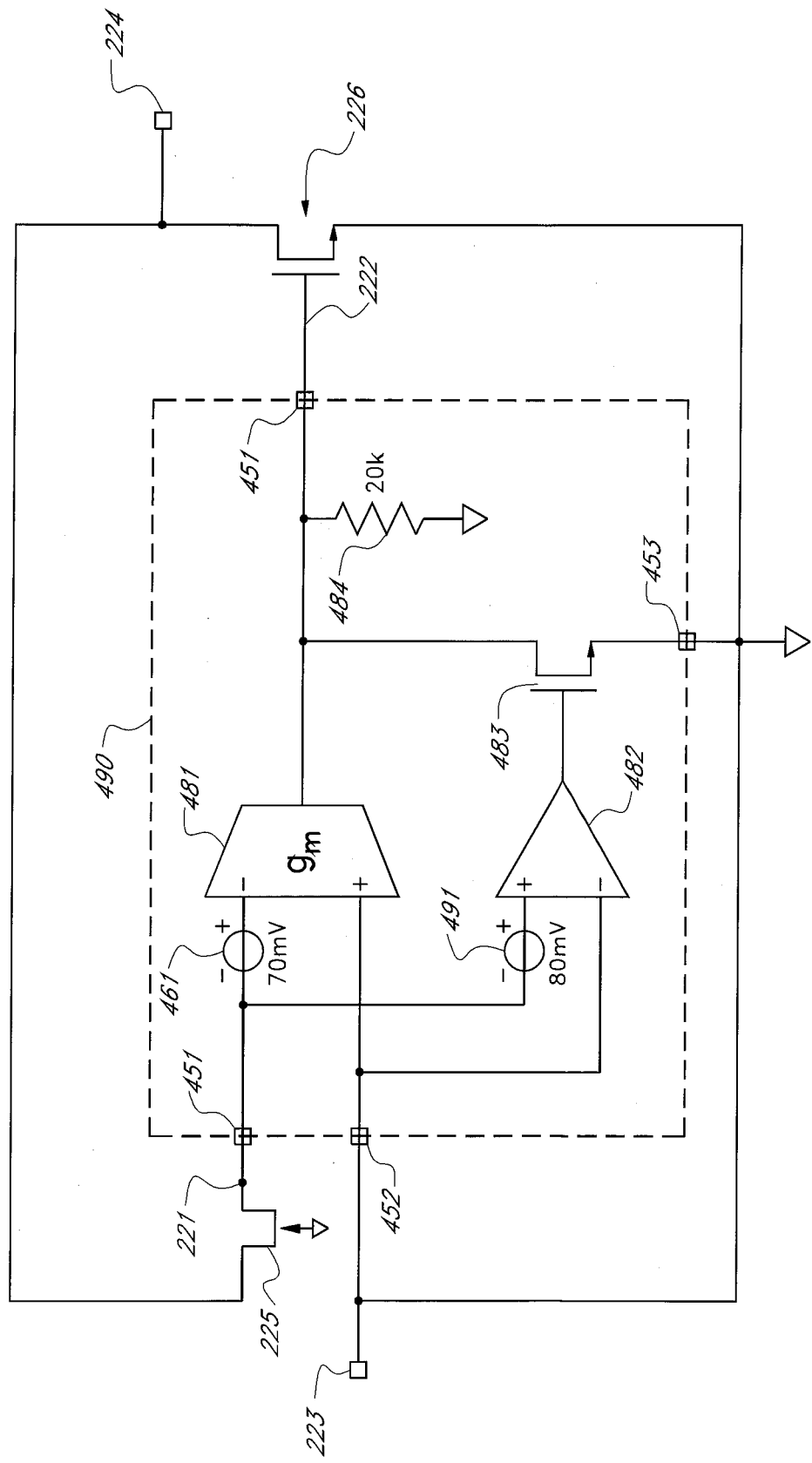
FIG. 17 is a schematic diagram further illustrating the application of FIG. 16.

FIG. 17 is a schematic diagram further illustrating the application of FIG. 16. FIG. 17 shows the JFET 225 and the power MOSFET 226 of the integrated circuit 220 as connected to the terminals of the controller 490 in the example of FIG. 16. In the example of FIG. 17, the controller 490 includes a transconductance amplifier 481, a comparator 482, a MOSFET 483, and a resistor 484. The negative terminal of the transconductance amplifier 481 and the positive terminal of the comparator 482 sense the voltage on the drain of the power MOSFET 226 by way of the drain sense terminal 221. As before, the JFET 225 protects the transconductance amplifier 481 and the comparator 482 from high voltage that may be present on the drain of the power MOSFET 226. The offset voltages 461 and 491 set the regulated forward voltage drop on the power MOSFET 226, which is between 70 mV and 80 mV in the example of FIG. 17. When the drain voltage of the power MOSFET 226 becomes negative, the comparator 482 switches ON the MOSFET 483, which in turn switches OFF the power MOSFET 226.

Integrated field effect transistors with high voltage drain sensing and methods of fabricating same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An integrated circuit comprising:
   a power metal oxide semiconductor field effect transistor (MOSFET) having a drain, a gate, and a source;
   a junction field effect transistor (JFET) having a drain, a gate, and a source, the source of the JFET being coupled to a drain sense terminal of the integrated circuit, the drain of the JFET being coupled to the drain of the power MOSFET and a drain terminal of the integrated circuit, the JFET and the power MOSFET sharing a same drift region on a substrate of the integrated circuit;
   a source terminal of the integrated circuit coupled to the source of the power MOSFET; and
   a gate terminal of the integrated circuit coupled to the gate of the power MOSFET.

2. The integrated circuit of claim 1, wherein the integrated circuit is packaged in a four terminal small outline integrated circuit (SOIC) package.

3. The integrated circuit of claim 1 wherein the integrated circuit only includes the JFET and the power MOSFET.

4. The integrated circuit of claim 1 wherein the JFET and the power MOSFET are vertical transistors, and configured to use the substrate of the integrated circuit as the drain.

5. The integrated circuit of claim 1 wherein the drift region of the JFET and the power MOSFET includes an epitaxial layer formed on the substrate.

6. The integrated circuit of claim 5 wherein the substrate comprises an N-type silicon substrate.

7. An integrated circuit comprising:
a power MOSFET;
a JFET sharing a same drift region with the power MOSFET on a same substrate;
a drain sense terminal coupled to a drain of the power MOSFET through the JFET, the drain sense terminal being external to a package of the integrated circuit and configured to allow an external circuit to sense the drain of the power MOSFET; and
a gate terminal coupled to a gate of the power MOSFET, the gate terminal being external to the package of the integrated circuit.

8. The integrated circuit of claim 7 wherein the power MOSFET and the JFET are vertical trench-gate transistors.

9. The integrated circuit of claim 7 wherein the package is a four terminal SOIC package.

10. The integrated circuit of claim 7 wherein the integrated circuit only includes the JFET and the power MOSFET.

11. The integrated circuit of claim 7 wherein the drift region comprises an epitaxial layer.

* * * * *